(12) United States Patent
Wilkins et al.

(10) Patent No.: US 7,656,028 B2
(45) Date of Patent: Feb. 2, 2010

(54) SYSTEM FOR CONTROLLING THE TEMPERATURE OF AN ASSOCIATED ELECTRONIC DEVICE USING AN ENCLOSURE HAVING A WORKING FLUID ARRANGED THEREIN AND A CHEMICAL COMPOUND IN THE WORKING FLUID THAT UNDERGOES A REVERSIBLE CHEMICAL REACTION TO MOVE HEAT FROM THE ASSOCIATED ELECTRONIC DEVICE

(75) Inventors: Wendy L. Wilkins, Rochester, MN (US); Barry K. Gilbert, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 25 days.

(21) Appl. No.: 11/816,674

(22) PCT Filed: Feb. 21, 2006

(86) PCT No.: PCT/US2006/006126

§ 371 (c)(1),
(2), (4) Date: Aug. 20, 2007

(87) PCT Pub. No.: WO2006/091603

PCT Pub. Date: Aug. 31, 2006

(65) Prior Publication Data

US 2008/0258295 A1    Oct. 23, 2008

Related U.S. Application Data

(60) Provisional application No. 60/655,558, filed on Feb. 23, 2005.

(51) Int. Cl.
| | | |
|---|---|---|
| H01L 23/34 | (2006.01) | |
| H01L 23/12 | (2006.01) | |
| H01L 23/10 | (2006.01) | |
| H05K 5/02 | (2006.01) | |
| H05K 7/20 | (2006.01) | |

(52) U.S. Cl. .............................. 257/714; 257/E23.088; 257/713; 257/704; 257/706; 257/707; 257/E23.097; 257/721

(58) Field of Classification Search .......... 257/E23.088, 257/713, 714, 706, 707, 704, 710, 711, 721, 257/E23.097
See application file for complete search history.

(56) References Cited

U.S. PATENT DOCUMENTS

| | | | | |
|---|---|---|---|---|
| 3,091,920 | A * | 6/1963 | Matvay | 60/275 |
| 3,303,067 | A * | 2/1967 | Haering et al. | 438/161 |
| 3,993,123 | A * | 11/1976 | Chu et al. | 165/80.3 |
| 4,649,990 | A * | 3/1987 | Kurihara et al. | 165/80.4 |
| 5,198,889 | A * | 3/1993 | Hisano et al. | 257/678 |
| 5,625,227 | A * | 4/1997 | Estes et al. | 257/712 |

(Continued)

OTHER PUBLICATIONS

International Search Report and Written Opinion corresponding to PCT/US2006/006126 under date of mailing of Feb. 9, 2007.

*Primary Examiner*—Alexander O Williams
(74) *Attorney, Agent, or Firm*—Quarles & Brady LLP

(57) ABSTRACT

A package for a semiconductor chip or other heat producing device has a supporting substrate to which the devices mount and electrically connect. An enclosure is formed over the heat producing devices and filled with a working fluid including a chemical compound that reacts endothermically to absorb heat produced by the devices and releases the heat in a reverse reaction to the enclosure.

28 Claims, 2 Drawing Sheets

U.S. PATENT DOCUMENTS

| | | | |
|---|---|---|---|
| 5,931,222 A * | 8/1999 | Toy et al. | 165/80.3 |
| 5,946,544 A * | 8/1999 | Estes et al. | 438/15 |
| 6,200,536 B1 * | 3/2001 | Tonkovich et al. | 422/177 |
| 6,647,777 B1 * | 11/2003 | Kotaka et al. | 73/204.26 |
| 2002/0159233 A1 * | 10/2002 | Patel et al. | 361/702 |
| 2003/0075311 A1 | 4/2003 | Seaba et al. | |
| 2004/0141296 A1 * | 7/2004 | Coico et al. | 361/752 |
| 2005/0068739 A1 * | 3/2005 | Arvelo et al. | 361/718 |
| 2005/0151555 A1 | 7/2005 | Lewis et al. | |
| 2005/0168947 A1 * | 8/2005 | Mok et al. | 361/698 |

* cited by examiner

SYSTEM FOR CONTROLLING THE TEMPERATURE OF AN ASSOCIATED ELECTRONIC DEVICE USING AN ENCLOSURE HAVING A WORKING FLUID ARRANGED THEREIN AND A CHEMICAL COMPOUND IN THE WORKING FLUID THAT UNDERGOES A REVERSIBLE CHEMICAL REACTION TO MOVE HEAT FROM THE ASSOCIATED ELECTRONIC DEVICE

CROSS-REFERENCE TO RELATED APPLICATIONS

This application is based on U.S. Provisional Patent Application Ser. No. 60/655,558, filed on Feb. 23, 2005, and entitled "COOLING MECHANISM FOR SELF-CONTAINED INTEGRATED CIRCUIT USING A REVERSIBLE ENDOTHERMIC CHEMICAL REACTION" and international Patent Application PCT/US2006/006126, filed Feb. 21, 2006, and entitled "COOLING MECHANISM FOR SELF-CONTAINED INTEGRATED CIRCUIT USING A REVERSIBLE ENDOTHERMIC CHEMICAL REACTION."

BACKGROUND OF THE INVENTION

The field of the invention is the packaging of electronic devices such as semiconductors, and particularly, the cooling of such devices.

Modern digital and analog integrated circuits ("chips") are consuming ever-larger amounts of DC power as the number of transistors per unit area is increased in digital chips, and as the amount of output power required of analog chips (such as power amplifiers) is increased through the use of improved design techniques, more capable transistors, and new transistor materials (in the latter case: silicon germanium bipolar transistors; indium phosphide, gallium nitride, and silicon carbide transistors). The chips convert all or much of the DC power that they absorb from the power supply into heat: in the case of digital circuits, almost all of the DC input power becomes waste heat: and in the case of analog (i.e., amplifier) chips, 50-80% of the DC input power becomes waste heat. This waste heat must be removed to assure that the chip (or multiple chips in a subsystem) do not self-destruct. Silicon and indium phosphide chips can operate at temperatures up to approximately 85° C. Gallium nitride and silicon carbide chips can survive to much higher temperatures but still have a maximum operating temperature. The problem is that with ever-tighter packing of transistors on all of these chips, the power densities (heat loads) of these chips, measured in watts of power per square centimeter of chip area, are increasing very dramatically. Several years ago, a chip with thermal densities above 10 $W/cm^2$ was the norm; presently, even silicon chips have been designed with power densities of 350 $W/cm^2$. Prototype versions of gallium nitride and silicon carbide chips have been demonstrated "in the laboratory" operating at power densities in the range of 1500-3500 $W/cm^2$ and III-V compound semiconductor chips operate in the range of 450 $W/cm^2$. If these heat loads are not removed and the chips held to below their maximum operating temperatures, they will not only cease to function but may even completely self-destruct.

Many mechanisms have been used to cool "hot" chips. The two most common are conduction cooling and convection cooling, and the two are often combined. In the former, a chip is bonded (soldered or epoxy-attached) into a package which contains a large metal mass, such that the heat flows from the back of the chip directly into the metal mass, and then into a finned radiator, over which cool air is blown to remove the heat. In some cases, the lower temperature "sink" is a cold plate through which cold water, fluorocarbon, or other working fluid is passed as a transport fluid. In fact, for each level of chip power density, there are a range of cooling options that best match the overall system design considerations. The chart in FIG. 1 illustrates this point. As the overall power density of the chip increases, the cooling options decrease, and at power densities above 100-200 $W/cm^2$, the options become quite limited. Chip cooling by directly pumping a working fluid such as fluorocarbon onto the chip(s) has been developed and cutting microchannels in the back of the chips and pumping liquid through the microchannels has been developed in an effort to operate at these power densities.

SUMMARY OF THE INVENTION

This invention is a completely self-contained and encapsulated "package" into which a high power integrated circuit ("chip") can be installed to provide the necessary thermal and electrical environment to assure that the chip works correctly. The packaging approach not only assures that DC electrical power will be delivered to the chip and AC signals will be brought into and led from the chip in a correct manner, but also that the operating temperature of the chip will remain below its maximum survivable operating temperature. For this cooling approach, a working fluid that consists of at least one chemical compound that will react endothermically is introduced into the area above the chip. The reaction is reversible: the reaction product is carried away from the chip to the walls of the package where the reverse reaction occurs and heat is released to a "cold plate" or "cold pipe." The reaction rates can be increased by the use of catalysts coated on the heat generating areas of the chip, the wall of the package, or both.

An advantage of this invention is that it allows for direct device-side cooling of the device. The device is mounted to a substrate and an enclosed space is formed around the device which contains the working fluid. The much larger enclosure is cooled by more conventional means. The result is that cooling can take place through both sides of the device, rather than just the backside. This technique can be utilized with devices that are flip-chip attached or wirebonded to the substrate. Passivation of the device is not required with selection of the proper working fluid. Direct cooling is done through the use of endothermic reactions. The use of a working fluid eliminates the problems of vapor entrapment and thermal shock due to the incipience temperature drop that are seen with phase change cooling.

This invention does not adversely affect the electrical performance of the device. A thermally conductive but electrically insulating working fluid surrounds the interconnection between the device and the substrate. The invention does not cause dielectric losses such as the dielectric losses caused by glob top used on wire- or ribbon-bonded packages.

This invention also offers some mechanical advantages over other thermal management methods. The number of thermal interfaces needed is reduced because the working fluid is in direct contact with the heat generating device. One of the issues with attachment of heat spreaders and heat sinks is the need to compensate for the coefficient of thermal expansion (CTE) mismatch between the chip, heat spreader, and the heat sink. Commonly, thermally conductive adhesive must be used to transition between the heat spreader, which typically has a coefficient of thermal expansion ("CTE") matched to the power device, and the heat sink, which is typically a high CTE material. This interface increases the thermal resistance of the conduction path which in turn increases the junction temperature. The invention offers advantages for high shock and vibration environments, because the thermal path presented by the working fluid is not structural.

This invention may easily be used in combination with other thermal management techniques. For wirebonded chips, for example, heat spreaders and heat sinks can be attached to the back of the chip or package while the heat is also removed from the top by the working fluid. Chip level cooling techniques such as thermal vias, thinned chips, on-chip integration of Peltier devices, microchannels in the back of the chip may also be used in conjunction with the working fluid.

DETAILED DESCRIPTION OF THE PREFERRED EMBODIMENT

This invention is a completely self-contained and encapsulated "package" into which a high power integrated circuit ("chip") such as an amplifier, or an entire subsystem (such as a radar "transmit-receive" module), can be installed to provide the necessary thermal and electrical environment to assure that the chip or multi-chip subsystem works correctly. The packaging approach not only assures that DC electrical power will be delivered to the chip(s) and AC signals will be brought into and led from the chip(s) in a correct manner, but also that the operating temperature of the chip(s) will remain below their maximum survivable operating temperature. This is accomplished by filling the package with a non-electrically conductive working fluid (or mixture) that contains at least one chemical compound that will react endothermically. This reaction must be reversible so that the heat can be discharged to a heat sink. A catalyst may used to increase the reaction rate of either the endothermic reaction or the reverse, exothermic reaction. The primary package containing the chip(s) and a working fluid are completely hermetically sealed, and in the preferred embodiment the entire cooling process is a transfer of heat from the source of the heat (the chips) to the surface of a heat exchanger, with the heat transferred by the working fluid. An entire multi-chip system, such as a phased-array radar receiver transmit/receive module, with all of its chips and support components, can be packaged in the same manner as the "single chip" described below.

Figure 2:
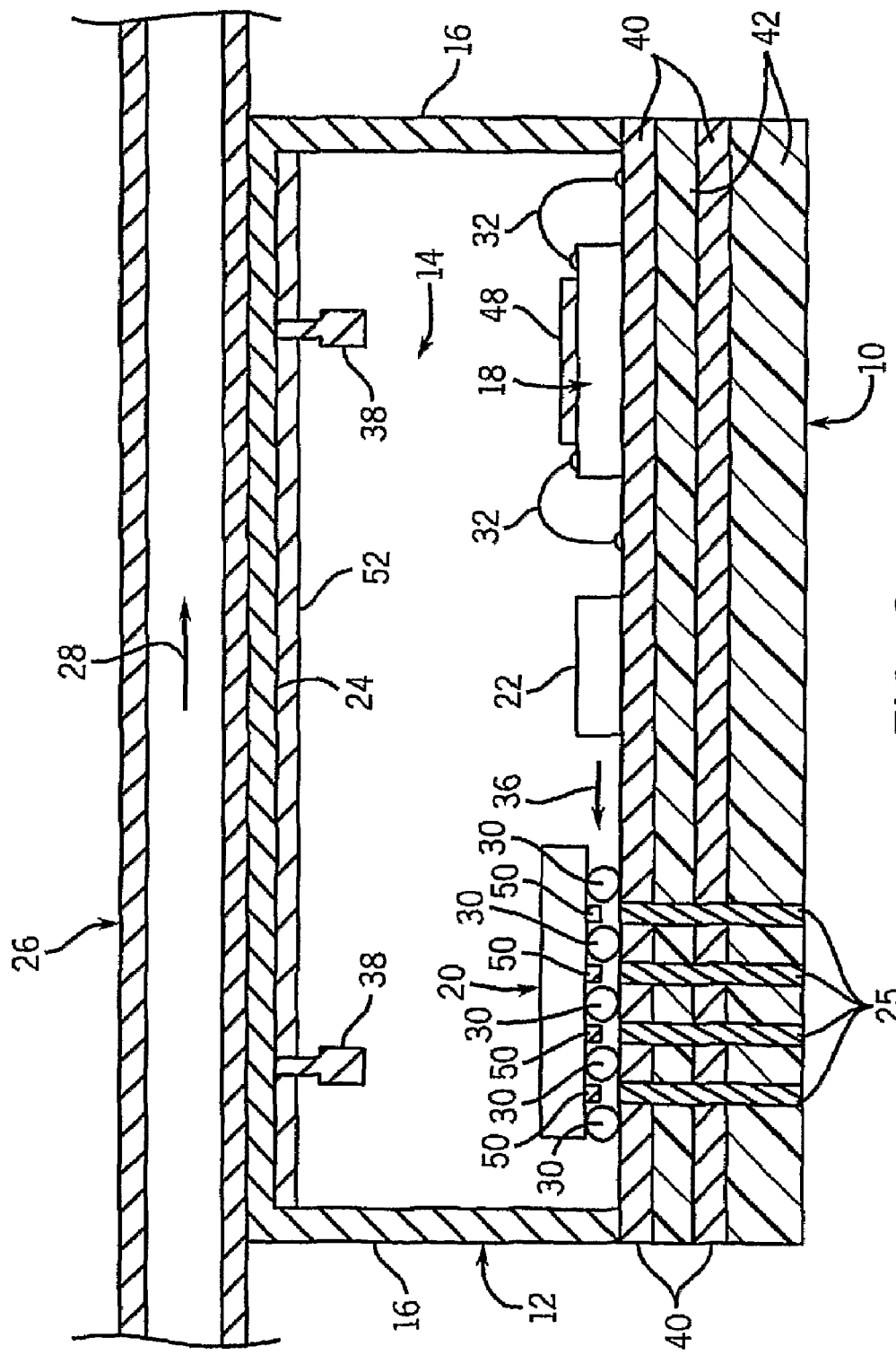
FIG. 2 is a pictorial representation of a preferred embodiment of the invention.

Referring particularly to FIG. 2, a preferred embodiment of the invention includes a substrate 10 which supports on its top surface one or more devices. As will be explained in more detail below, three devices 18, 20 and 22 are shown in this embodiment, but the invention is not limited to the particular devices used. An enclosure 12 made of a heat conductive material such as aluminum is attached to the substrate 10 and it extends over the devices 18, 20 and 22 to form an enclosed space indicated generally at 14. The enclosure 12 has side walls 16 that extend away from the top surface of the substrate 10 and surround the supported devices 18, 20 and 22 and a top wall 24 that covers the enclosed space 14. A heat exchanger in the form of a pipe 26 is in thermal contact with the top wall 24 and a cooling fluid indicated by arrow 28 is pumped through the pipe 26 to maintain the temperature of the top wall 24 at a desired level.

During operation, one or more of the devices 18 and 20 produce significant amounts of heat which must be removed if the temperature is to be maintained below destructive levels. This is accomplished by a working fluid that fills the enclosed space 14. The circulation of a working fluid that contains species that react endothermically, thus removing heat from the chip. The reaction is reversed at the wall of the heat exchanger, thus releasing the heat. The working fluid transfers the heat from the chips to the heat exchanger by extracting the heat in the chemical reaction. The product(s) of the reaction is/are moved to the top of the package by natural convection where the reaction reverses itself releasing heat to the heat exchanger. The temperature difference between the fluid near the chip and the fluid at the wall of the heat exchanger side of the package creates a natural convective flow due to the difference in density of the working fluid within the thermal gradient. The hot spots on the devices 18 and 20 can be coated with a catalyst to enhance the endothermic reaction and/or the top of the package may be coated with a catalyst to enhance the exothermic reaction.

The nature of the working fluid in the present invention is distinctive from prior cooling techniques. The use of working fluids in other approaches to the cooling of high power chips typically relies on the conversion of a liquid to a vapor, and the large latent heat of vaporization associated with this phase change. The present invention does not rely on the change of phase of the working fluid, but instead, on the heat absorption that takes place during the chemical reaction between the reactants contained in the working fluid. The working fluid may consist entirely of the reactants and reaction products or it may also contain a solvent. The working fluid may be a single phase gas or liquid or may be multi-phase. For the primary embodiment, the working fluid should be selected such that it is electrically non-conductive and is non-corrosive to the chip. Ideally, the working fluid also has the following properties: extremely low viscosity, high thermal conductivity, high heat capacity, low surface tension, and low dielectric constant.

The use of a non-conductive working fluid allows a large degree of flexibility in the way that integrated circuits are installed into the package. As depicted in FIG. 2, integrated circuits can be mounted "face up" (e.g., the rightmost device 18) and wire bonded to make electrical contact with contact pads on the floor of the package. Alternately, chips can be "flip-chip" mounted, as illustrated by the leftmost device 20 in FIG. 2.

The rightmost device 18 in FIG. 2 is an unpassivated wire-bonded chip mounted with its active or "top" surface face-up. Electrical connections are made with "wire bonds" from the chip pads to contact pads on the supporting substrate 10. Power and signal feeds to the contact pads on the chip can be by means of wire or ribbon bond 32, or a so-called chips first MCM overlay on the active chip surface. A unique feature of using a working fluid with an appropriate chemistry as the heat transport mechanism is that unpassivated chips such as the III-V compound semiconductors such as gallium arsenide and indium phosphide can be exposed to the working fluid directly without concern for corrosion caused by the fluid. Further, if the dielectric constant of such a working fluid approaches that of air (i.e., 1.0), the electrical performance of microwave and millimeter wave analog chips will not be compromised by the presence of the working fluid above the active surface of the analog chip.

The leftmost device 20 is mounted to the substrate 10 such that its active surface is face-down, with electrical connections (signals, power, and ground) made between the contact pads on that chip and contact pads on the substrate 10 using solder balls or bumps, or gold balls 30. Unlike most chips attached in this manner (referred to as a "flip-chip" attachment), no epoxy or other type of "underfill" is inserted between the chip 20 and the substrate 10. The space between the solder bumps or gold balls 30 is thus accessible to the working fluid and it becomes an integral part of the cooling approach for this system. Very tiny externally powered micropumps, of either conventional or unconventional design, may be incorporated inside the enclosed space 14 to move the working fluid. Microfluidic pumps of unconventional design such as a solid-state Micro-Electro-Mechanical System (MEMS) pump indicated at 22 may be employed to move fluid beneath the chip 20 as indicated by arrow 36. The pump 22 serves two purposes. First, it transports a small quantity of fluid into the interstices between the gold or solder ball bonds 30 on one or two sides of chips mounted "face down," thus allowing heat to be carried away from the active surface of the chip and into the volume above all the chips. In the usual implementation of flip chip attachment, only the solder or gold ball bonds 30 conduct heat, because the interstices are usually filled with low-thermal-conductivity solid epoxy material. The combination of thermal conduction through the solder or gold balls 30, the heat removal by chemical reaction, and movement of the working fluid between the active face of the chip 20 and the substrate 10 increases the amount of heat transferred from the active surface of the chip. Secondly, the pump 22 increases the rate in which the chemical species are moved between the chip and the heat sink. This movement can also serve to increase the overall rate of heat transfer out of the package.

Figure 1:
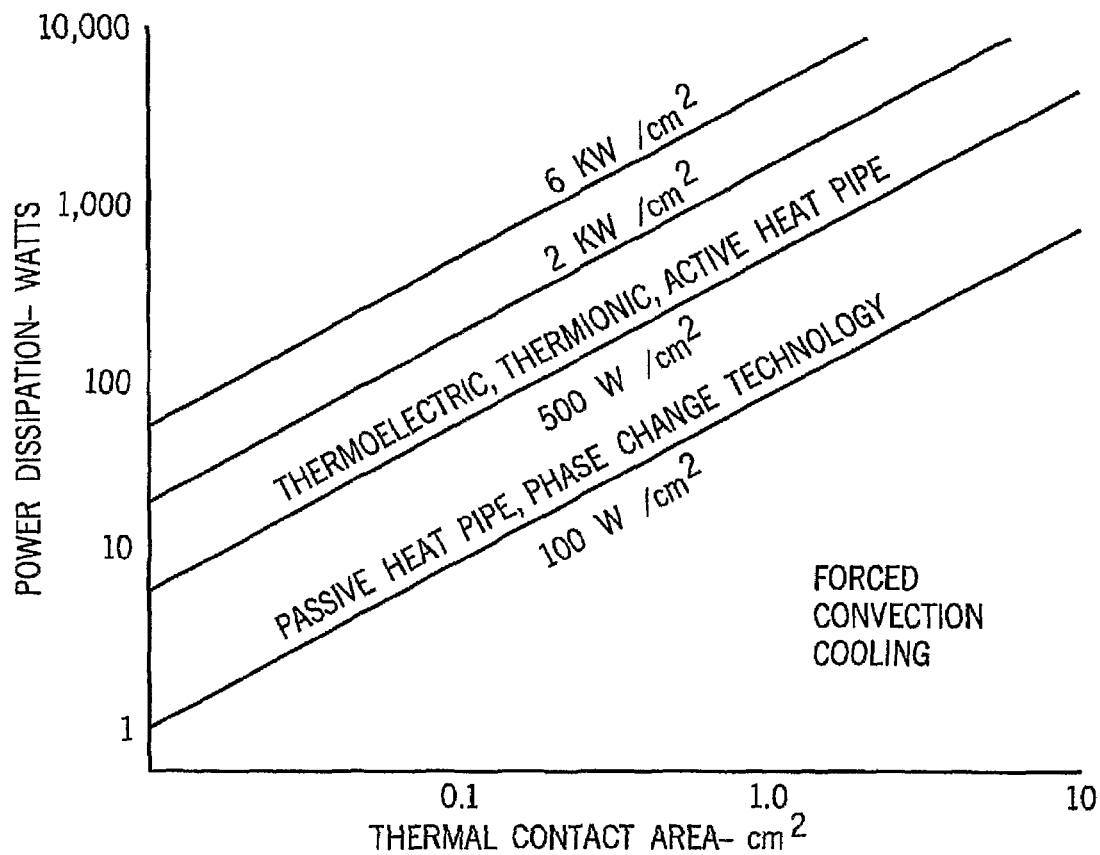
FIG. 1 is a graphic indication of the ranges of different cooling techniques.
Figure 3:
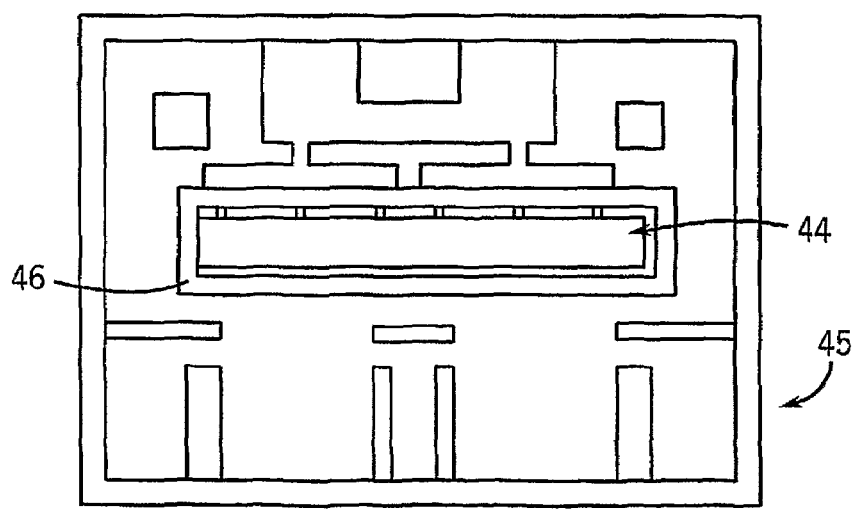
FIG. 3 is a top view of an integrated circuit in a high power module.

Referring to FIGS. 2 and 3, a preferred embodiment of the invention uses a catalyst to increase the reaction rate of either the endothermic reaction or the reverse, exothermic reaction. In the case of the endothermic reaction, the catalyst can be a thin film material such as palladium or platinum that is selectively applied or patterned on top of the hot areas of the chip or to the entire chip. The catalyst enhances the endothermic reaction so that more heat is absorbed from the electronic device. As shown in FIG. 3, a chip 45 in high power mode has a patterned layer of catalyst 46 in the shape of a rectangle applied around the border of a rectangular hot zone 46 of the chip 45. The embodiment shown in FIG. 2 depicts a catalyst 48 disposed on the top of the device 18 and a catalyst 50 patterned on the front side of device 20 in between the solder or gold ball bonds 301. In the case of the exothermic reaction, a catalyst can be a thin film material such as platinum and rhodium, iron, or nickel that is selectively applied or patterned to the enclosure. A catalyst enhances the exothermic reaction so that more heat is released to the enclosure. The embodiment shown in FIG. 2 depicts a catalyst 52 disposed on the top wall 24 of the enclosure 12.

The system will function properly in essentially any position with respect to gravity. The embodiment shown in FIG. 2 depicts a completely closed and hermetic cooling implementation in which the flow of working fluid is driven by the source of and sink for the heat (the chips and the heat exchanger respectively). Baffles 38 attached to the top 24 of the enclosure 12 are installed to create turbulence in the convective flow of the working fluid. This increases the transfer of heat from the working fluid to the heat-exchanging surface(s). Baffles of several different designs are possible, the shape, size, and position of which will depend on the characteristics of the selected working fluid.

The preferred embodiment of the invention employs a working fluid containing chemical compounds such as the chemical compounds used in closed loop thermochemical energy storage systems. Such chemical compounds are used in solar collectors, heat pumps, and a piston-less version of a Stirling cycle engine with a catalytic regenerator, as in U.S. Pat. No. 3,871,179. During operation, the working fluid contains reactants and the reaction product. The working fluid may also contain a solvent. Any appropriate chemical compound may be used that provides for endothermic and exothermic reactions. Preferred embodiments of the invention may employ the following chemical compounds:

1. Nitric Oxide Synthesis and Dissociation Reactions

The nitric oxide dissociation reaction is similar to one of the reactions that takes place in a vehicle's catalytic converter. In an embodiment of the present invention, the reaction of nitrogen and oxygen to form nitric oxide removes heat from the device. The heat is released to the enclosure when the reverse reaction occurs at the enclosure in the presence of a platinum and rhodium catalyst deposited on the enclosure. The heat of reaction is 180 kJ/mol (6 kJ/g of NO). This reaction can remove more than 150 W if the reaction rate exceeds 0.0008 mol/sec.

2. Ammonia Dissociation and Synthesis Reactions

Solar collectors and heat pumps utilize a reaction in which heat is absorbed when ammonia dissociates into nitrogen and hydrogen. In an embodiment of the present invention, the dissociation of ammonia into nitrogen and hydrogen removes heat from the device. The heat is released to the enclosure when the nitrogen and hydrogen combine to form ammonia in the presence of an iron catalyst deposited on the enclosure. The heat of reaction is 92 kJ/mol.

3. Cyclohexane Dehydrogenation and Benzene Hydrogenation Reactions

In an embodiment of the present invention, a platinum catalyst coated on the device aids the heat-absorbing cyclohexane dehydrogenation reaction which forms benzene and hydrogen. The heat is released to the enclosure by the reverse reaction in which the benzene and hydrogen recombine to form cyclohexane in the presence of nickel deposited on the enclosure. The heat of reaction is 206 kJ/mol.

Heat removal can be increased by forming microchannels on the chip and by pumping working fluid through the microchannels. A catalyst can be coated inside the microchannels to increase the reaction rate of the endothermic reaction that occurs within the microchannels.

The substrate 10 is a material comprised of alternate layers of metal 40 that provide circuitry for power and ground distribution to the chips, and for the distribution of AC electrical signals to and from the chips. Between the metal layers 40 are insulating dielectric layers 42. In the case of chips that are flip-chip attached to the substrate 10, the coefficient of thermal expansion of the substrate 10 must closely match that of the chip in order to reduce stress on the interconnection between the chip and the substrate 10 since underfill is not used. If, for example, the substrate is low-temperature or high-temperature cofired ceramic, the substrate may itself contribute to the removal of heat from the interior space 14 of the package.

Heat removal can be increased by using other thermal management techniques in combination with the working fluid. These include, for example, increasing the fluid flow by means of baffles 38 or active pumping of the fluid with pump 22. Also, thermal vias 25 may be formed through the substrate 10 at points beneath the heat producing device 20. These are metal coated or filled throughholes that provide heat conductive paths through the substrate 10 at points where the temperature peaks. The higher thermal conductivity of the vias 25 lowers the temperature at these points.

We claim:

1. A package for an electronic device which produces heat during its operation, which comprises:
   a substrate containing electrical conductors;
   means for mounting the electronic device to the substrate and electrically connecting it to the conductors therein;
   an enclosure disposed over the top surface of the substrate to form an enclosed space; and
   a working fluid disposed in the enclosed space and including a chemical compound that reacts endothermically to absorb heat produced by the electronic device and that reacts exothermically to release heat to the enclosure.

2. The package as recited in claim 1 in which the enclosure is cooled.

3. The package as recited in claim 1 in which the chemical compound comprises nitric oxide and its reactants.

4. The package as recited in claim 3 in which a platinum and rhodium catalyst is disposed on the enclosure to enhance the exothermic reaction and thereby release more heat to selected locations on the enclosure.

5. The package as recited in claim 1 in which the chemical compound comprises ammonia and its reactants.

6. The package as recited in claim 5 in which an iron catalyst is disposed on the enclosure to enhance the exothermic reaction and thereby release more heat to selected locations on the enclosure.

7. The package as recited in claim 1 in which the chemical compound comprises cyclohexane and its reactants.

8. The package as recited in claim 7 in which a platinum catalyst is disposed on the electronic device to enhance the endothermic reaction and thereby absorb more heat from selected locations on the electronic device.

9. The package as recited in claim 7 in which a nickel catalyst is disposed on the enclosure to enhance the exothermic reaction and thereby release more heat to selected locations on the enclosure.

10. The package as recited in claim 1 in which a catalyst is disposed on the electronic device to enhance the endothermic reaction and thereby absorb more heat from selected locations on the electronic device.

11. The package of claim 10 in which the electronic device has a plurality of microchannels and the catalyst is disposed within the microchannels.

12. The package as recited in claim 1 in which a catalyst is disposed on the enclosure to enhance the exothermic reaction and thereby release more heat to selected locations on the enclosure.

13. The package as recited in claim 1 in which the working fluid is electrically insulating and is in direct contact with the electronic device.

14. The package as recited in claim 12 in which the electronic device is an integrated circuit chip.

15. The package as recited in claim 14 in which the integrated circuit chip is mounted face up with exposed wire bonds.

16. The package as recited in claim 14 in which the integrated circuit chip is mounted face down.

17. The package as recited in claim 1 which includes baffles disposed in the enclosure to direct the flow of the working fluid therein.

18. The package as recited in claim 1 which includes a pump disposed in the enclosure to increase the flow of working fluid around the electronic device.

19. The package as recited in claim 18 in which a space is formed between the electronic device and the substrate and the pump is positioned to increase the flow of working fluid in this space.

20. The package as recited in claim 1 in which heat conductive vias are formed through the substrate and positioned beneath the electronic device.

21. A system comprising:
   a substrate containing electrical conductors configured to be electrically connected to an electronic device;
   an enclosure disposed over the substrate to form an enclosed space therebetween;
   a working fluid disposed in the enclosed space; and
   a chemical compound disposed in the working fluid that is configured to undergo a first chemical reaction upon receiving heat from the substrate and undergo a second chemical reaction to release the heat to the enclosure.

22. The system of claim 21 wherein the first chemical reaction is an endothermic chemical reaction that absorbs the heat received from the substrate.

23. The system of claim 21 wherein the second chemical reaction is an exothermically chemical reaction that releases the heat to the enclosure.

24. The system of claim 21 wherein the chemical compound includes at least one of nitric oxide and nitric oxide reactants, ammonia and ammonia reactants, and cyclohexane and cyclohexane reactants.

25. The system of 24 further comprising a catalyst configured to enhance at least one of the first and the second chemical reactions.

26. The system of claim 25 wherein the catalyst includes at least one of a platinum catalyst, a rhodium catalyst, an iron catalyst, and a nickel catalyst.

27. The system of claim 1 wherein the working fluid is electrically insulating and is in direct contact with the electronic device.

28. The system of claim 1 further comprising at least one of a plurality of baffles formed in the enclosure and a pump configured to direct the flow of the working fluid therein.

* * * * *